United States Patent [19]

Cavicchi et al.

[11] Patent Number: 4,698,455
[45] Date of Patent: Oct. 6, 1987

[54] SOLAR CELL WITH IMPROVED ELECTRICAL CONTACTS

[75] Inventors: Bruce T. Cavicchi, Granada Hills; Hans G. Dill, Newhall; Dieter K. Zemmrich, Northridge, all of Calif.

[73] Assignee: Spectrolab, Inc., Sylmar, Calif.

[21] Appl. No.: 927,283

[22] Filed: Nov. 4, 1986

[51] Int. Cl.⁴ .............................................. H01L 31/06
[52] U.S. Cl. ..................................... 136/256; 136/262
[58] Field of Search ......................... 136/244, 256, 262

[56] References Cited

U.S. PATENT DOCUMENTS

| | | | |
|---|---|---|---|
| 3,527,619 | 9/1970 | Miley | 136/244 |
| 3,982,964 | 9/1976 | Lindmayer et al. | 136/256 |
| 4,252,573 | 2/1981 | Boer et al. | 136/256 |
| 4,336,648 | 6/1982 | Pschunder et al. | 29/572 |
| 4,395,583 | 7/1983 | Meulenberg, Jr. | 136/256 |
| 4,416,052 | 11/1983 | Stern | 29/572 |
| 4,540,843 | 9/1985 | Gochermann et al. | 136/251 |
| 4,564,720 | 1/1986 | Hogan | 136/256 |
| 4,652,693 | 3/1987 | Bar-on | 136/251 |

FOREIGN PATENT DOCUMENTS 60-157269  8/1985  Japan ..................... 136/262

*Primary Examiner*—Aaron Weisstuch
*Attorney, Agent, or Firm*—Terje Gudmestad; Paul M. Coble; A. W. Karambelas

[57] ABSTRACT

A gallium arsenide solar cell is disclosed which employs a front aluminum gallium arsenide window layer. Metallic grid lines for charge carrier collection traverse the window layer and extend through this layer to the emitter layer. A flat conductive bar on the window layer crosses and makes electrical contact with the metallic grid lines. A flat metallic strip located on the window layer near an edge is spaced from the grid lines and conductive bar but is electrically coupled to the conductive bar by metallic bridges. Since the metallic strip is not in contact with the grid lines, external electrical connections can be affixed to the flat metallic strip using high temperature welding or soldering techniques without damage to the semiconductor body.

11 Claims, 4 Drawing Figures

SOLAR CELL WITH IMPROVED ELECTRICAL CONTACTS

BACKGROUND OF THE INVENTION

1. Field of the Invention

The present invention relates in general to solar cells, and more particularly to solar cells with front contacts having improved electrical and mechanical characteristics.

2. Description of the Related Art

Conventional gallium arsenide (GaAs) solar cells consist of a semiconductor body having an aluminum gallium arsenide window layer overlying a gallium arsenide emitter layer which in turn overlies a gallium arsenide base (buffer) layer. The window layer and emitter are of either N-type or P-type conductivity while the base is of the opposite conductivity type being either P-type or N-type. An N-P or P-N semiconductor junction lies between the emitter and base layers. The emitter layer has a front light-receiving major surface adjacent the window layer and the base layer a back major surface. When light energy impinges on the front light-receiving surface of the cell, electrons and corresponding holes are created in both the emitter and base. For the most part, because of the presence of the semiconductor junction, electrons will be directed toward one major surface of the cell and holes toward the other major surface resulting in a photo-current density. In a typical P-N junction solar cell, holes move to the front light receiving surface of the cell and electrons toward the back surface. Metallic contacts are attached to the front and back surfaces of the solar cell semiconductor body to collect the electrons at one contact and holes at the other contact.

Great efforts have been exerted to make solar cells more efficient. The electrical contacts on the solar cell affect the overall efficiency of the solar cell, and therefore provide an area of concern to industry. The recombination of electrons or holes at the metal-to-semiconductor body interface and the contact resistance between metal contact and semiconductor body must both be kept to a minimum to achieve a high efficiency solar cell. Additionally, the front electrical contact must provide an area on which external contacts can be fastened by high temperature welding or soldering to form strong interconnections.

For gallium arsenide solar cells, the front contacts include grid lines and an ohmic bar. The grid lines provide the means for collecting the charge carriers from the semiconductor body, and the ohmic bar provides an area upon which electrical wire interconnections from other solar cells can be welded. Traditionally, the grid lines and ohmic bar have been placed directly on the aluminum gallium arsenide window layer. A low resistance contact between the metal contact and window layer, however, is difficult to achieve because the aluminum gallium arsenide has a tendency to oxidize and because of the large barrier height between the metal and the aluminum gallium arsenide.

Alternatively, grooves may be etched through the window layer exposing selective portions of the emitter layer. The grid lines and ohmic bar, made of an alloy including zinc, are disposed in the grooves making direct electrical contact to the emitter layer. Contacts fabricated onto the semiconductor body make low resistance contact to the emitter. However, high temperature welding or soldering of the interconnections to the ohmic bar will cause zinc from the metal contact to diffuse into the emitter layer and semiconductor junction region which degrades the efficiency of the cell.

SUMMARY OF THE INVENTION

It is therefore an object of this invention to provide a solar cell with electrical contacts having low contact resistance and yet excellent mechanical integrity.

It is a further object of this invention to provide a solar cell with improved efficiency.

In accordance with the foregoing objects, a solar cell according to the present invention includes a semiconductor body having at least one edge, and front and back essentially parallel major surfaces with at least three layers of semiconductor material therebetween including: a front aluminum gallium arsenide window layer, a middle gallium arsenide emitter layer and a back gallium arsenide base layer. A back metallic contact covers the back major surface of the cell. The front major surface is covered by a front metallic contact which includes a flat metallic strip adjacent the edge, a flat conductive bar located near the metallic strip, at least one metallic bridge electrically coupling the flat metallic strip to the flat conductive bar, and a plurality of metallic contact lines. The metallic contact lines cross the front exposed major surface and extend vertically through the aluminum gallium arsenide window layer to make electrical contact to the emitter layer for current collection. The conductive bar crosses and makes electrical contact to the metallic contact lines. Interconnection from other cells, therefore, can be welded or soldered to the flat metallic strip without excessively heating the metallic contact lines which are in contact with a sensitive region of the semiconductor body.

Other and further objects, advantages, and characteristic features of the present invention will become readily apparent from the following detailed description of preferred embodiments of the invention when taken in conjunction with the appended drawings.

BRIEF DESCRIPTION OF THE DRAWINGS

FIG. 1b is a cross-sectional view taken along line 1b—1b of FIG. 1a;

Figure 1A:
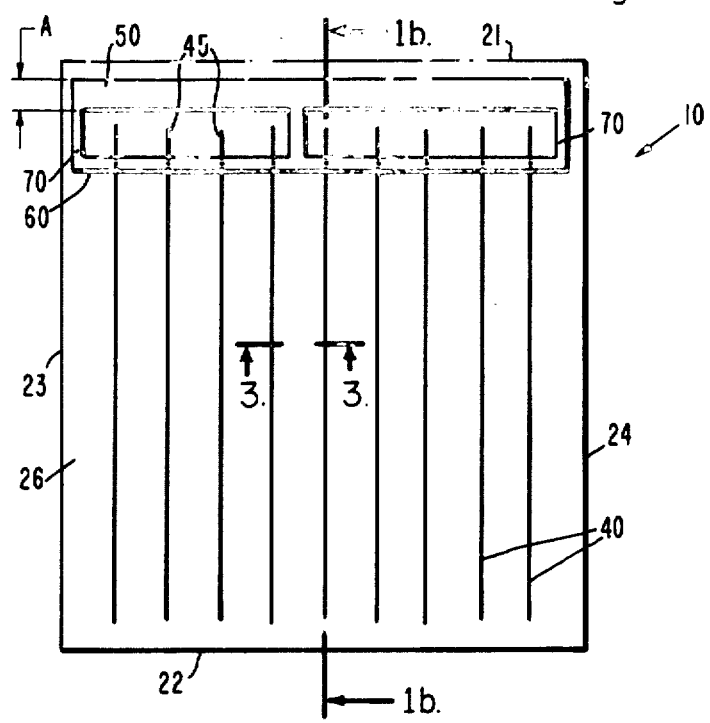
FIG. 1a is a plan view of a solar cell according to the principles of the invention.
Figure 1B:
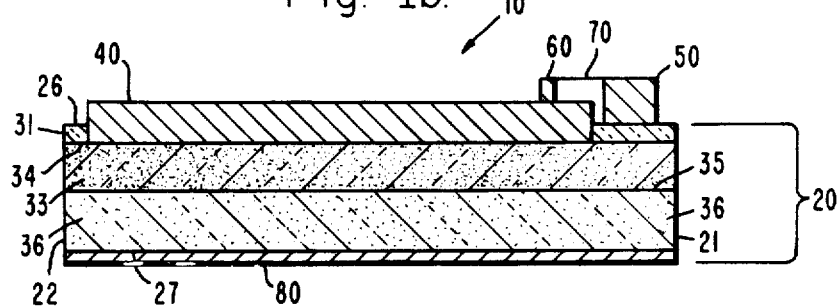
Figure 2:
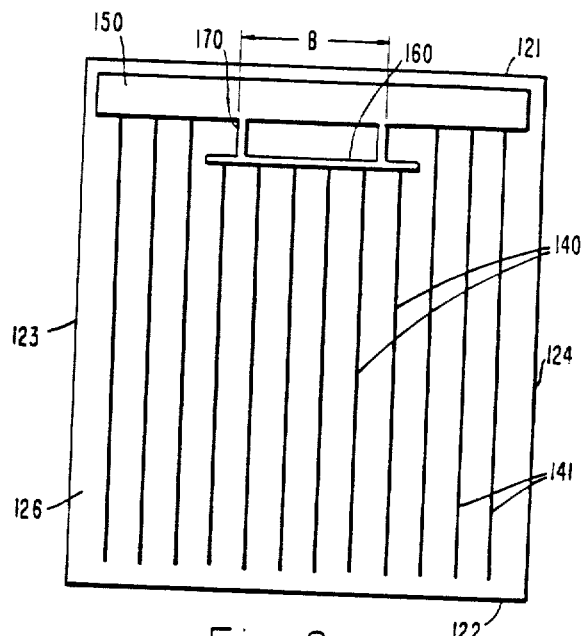
FIG. 2 is a plan view of a solar cell illustrating another embodiment of the present invention.
Figure 3:
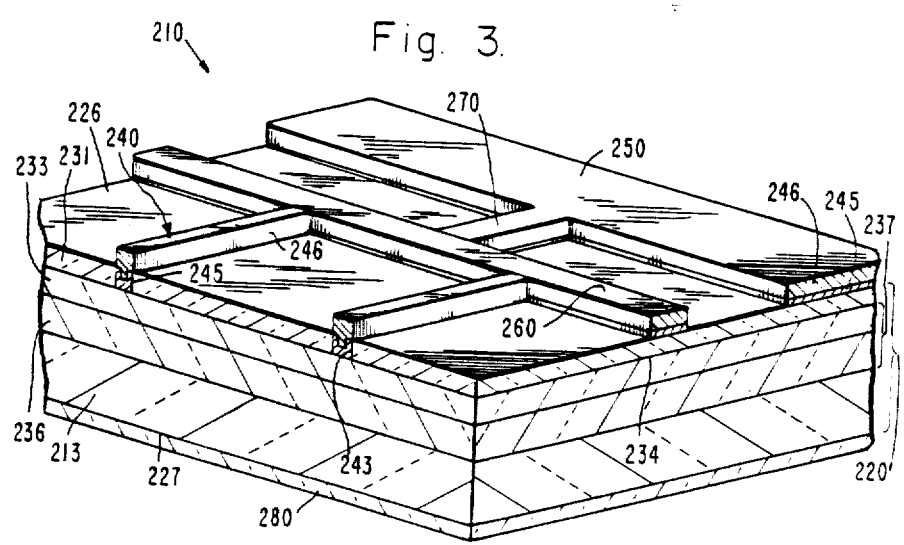
FIG. 3 is a perspective view, taken along lines 3—3 of FIG. 1a, illustrating a solar cell fabricated by a preferred method according to the principles of the invention.

It will be appreciated that FIGS. 1-3 are not drawn to scale.

DESCRIPTION OF THE PREFERRED EMBODIMENTS

Referring now with greater particularity to FIGS. 1a and 1b, a solar cell 10 is shown having a semiconductor body 20, the body having a first pair of opposed substantantially parallel sides 21 and 22, and a second pair of opposed substantially parallel sides 23 and 24 which are substantially perpendicular to the first pair of sides 21 and 22, and further having front and back major parallel surfaces 26 and 27, respectively. The semiconductor body 20 contains at least three layers of impurity doped semiconductor material, 31, 33, and 36. The front layer 31 is an aluminum gallium arsenide window layer, which may be of either p-conductivity or n-conductivity. The layer adjacent the window layer 31 is an emitter layer 33 and is of the same conductivity type as the window layer 31. The emitter layer 33 is made of gallium arsenide semiconductor material. A base layer 36 lies adjacent the emitter layer 33 and is of opposite conductivity type to the emitter layer 33, being either n or p conductivity and is made of gallium arsenide. An n-p or p-n junction 35 is located between the emitter and buffer layers, 33 and 36, respectively.

A plurality of essentially parallel metallic contact lines 40 longitudinally cross the front major surface 26 between opposite sides 21 and 22, being essentially parallel to sides 23 and 24. These contact lines 40 extend from near the edge of side 22 to a short distance from the side 21. The metallic lines 40 also extend through the aluminum gallium arsenide layer 31 to make contact to the front major surface 34 of the emitter layer 33. The contact lines 40 are essentially the same width, typically 15-25 microns.

A flat metallic strip 50 made of electrically conductive material is located on the front major surface 26. The flat metallic strip 50 lies adjacent side 21 of the semiconductor body 20. The flat metallic strip 50 may be a thin metal layer made of a layer of Au-Zn typically 1000Å thick and a layer of Ag typically 40,000Å thick over the Au-Zn layer, for example. The flat strip 50 is typically rectangular in shape, and may be as long as the length of the side 21 as shown in FIG. 1. The width of the strip 50 (dimension A) is typically about 0.03 inches, for example, which is wide enough for a wire interconnection to be welded or soldered to it. There is a separation between the end of the metal contact lines 40 and the contact strip 50.

A flat conductive bar 60 on the front major surface 26 traverses the metallic contact lines 40. The flat bar 60 is essentially parallel to the metallic strip 50 and is spaced a short distance from the strip 50, typically about 0.02 to 0.05 inches, for example. The flat conductive bar 60 makes electrical contact to the metallic contact lines 40. The conductive bar 60 may be a thin rectangular shaped layer of metal typically about, 0.01 to 0.02 inches wide, and may be made of Au-Zn-Ag, for example.

Metallic bridges 70 disposed on the front major surface 26 electrically couple the flat metallic strip 50 to the flat conductive bar 60. Three bridges 70 are shown in FIG. 1a but more or less than three bridges may be employed.

An ohmic contact 80 is disposed on the back major surface 27, and typically covers the entire back surface 27 of the solar cell.

A solar cell results in which the flat metallic strip 50 is separated from the metallic contact lines 40 which lie adjacent the thermally sensitive emitter layer 33. Therefore, high welding temperatures may be used to weld external contacts to the flat metal strip 50 without excessively heating the metallic contact lines 40, and thereby preventing damage to the underlying semiconductor body 20.

An alternative embodiment of a solar cell according to the invention is illustrated in FIG. 2. Components in the embodiment of FIG. 2 which are the same as or equivalent to respective components in the embodiment of FIGS. 1a and 1b are designated by the same second and third reference numeral digits as their corresponding components in FIGS. 1a and 1b, along with the addition of a prefix numeral "1". Similar to the above embodiment, this solar cell includes semiconductor body, a flat metallic strip 150, a flat conductive bar 160, and metallic bridges 170 electrically coupling the conductive bar 160 to the flat metallic strip 150. The conductive bar 160, however, only extends across a portion of the solar cell front major surface 126. A first plurality of adjacent substantially parallel metallic contact lines 140 longitudinally traverse a center region of the front major surface 26 from near side 122 to a short distance from the flat metallic strip 150. A second plurality of metallic contact lines 141 traverse the front major surface 126 from near side 122 to the flat metallic strip 150 extending a short distance under the strip 150. These contact lines 141 are located on outside regions of the front major surface adjacent the center region. An area of the flat metallic strip 150 designated by the letter B is not directly contacted by either the first or second plurality of metallic lines 140 and 141. High temperature welding may be performed on this area without excessively heating metallic contact lines 140 and 141. As a result, a solar cell is provided having improved performance and mechanical stability. Moreover, solar cells embodying the invention may be fabricated by relatively low-cost, high-yield processes.

A solar cell 210 fabricated according to a preferred method is illustrated in FIG. 3. Components in the embodiment of FIG. 3 which are the same as or equivalent to respective components in the embodiment of FIGS. 1a and 1b are designated by the same second and third reference numeral digits as their corresponding components in FIGS. 1a and 1b along with the addition of a prefix numeral "2".

Fabrication of the body of the semiconductor 220 is well-known in the art, which is illustrated by J. Euan, G. S. Kamath & R. P. Knechtli, "Large Area GaAlAs/GaAs Solar Cell Development," *Conference Record of the 11th I.E.E.E. Photovoltaic Specialists Conference*, page 409 (1975) and G. S. Kamath, J. Euan & R. Knechtli, "High Efficiency and Large Area GaAlAs GaAs Solar Cells", *12th I.E.E.E. Photovoltaic Specialists Conference*, page 929 (1976), which are incorporated herein by reference. The manufacture of a P-N-N+ gallium arsenide solar cell may begin with providing an N+ conductivity doped wafer substrate 213 with a concentration of about 1 to $3 \times 10^{18}$ impurity atoms per cubic centimeter. The substrate layer 213 may be gallium arsenide, although germanium or silicon may be used instead. The N type dopant may be tellurium, silicon, or tin, and a typical thickness for the substrate is about 300 microns, for example.

A layer 237 of N type conductivity gallium arsenide typically about 5-10 microns in thickness, is grown on top of the N+ gallium arsenide layer 213. The N-type dopant of layer 237 which may be of tellurium, silicon, or tin, typically has a concentration of 2 to $4 \times 10^{17}$ impurity atoms per cubic centimeter.

Next, an aluminum gallium arsenide layer 231 is grown on top of the N-layer 237. The aluminum gallium arsenide layer 231 is doped with a P-type dopant such as beryllium or zinc, for example, of a typical concentration of 1 to $3 \times 10^{18}$ atoms per cubic centimeter. Upon deposition of the aluminum gallium arsenide layer 231, the P-type dopant (such as beryllium atoms) from this layer diffuses into the N layer 237, converting a thin layer 233 of layer 237 (the emitter layer) adjacent the aluminum gallium arsenide layer 231 to P type conductivity. The layer 233 typically may have a thickness of about 0.3-0.5 microns, for example. After formation of the thin emitter layer 233, the remainder of layer 237 designated as layer 236 forms the base layer of the semiconductor body 220. The aluminum gallium arsenide layer 231 contains about $1 \times 10^{18}$ impurity atoms and is typically grown to a thickness of about 0.1–0.5 microns, for example.

After the semiconductor body has been fabricated, the back contact 280 is made by evaporating an alloy of Au-Ge-Ni-Ag over the back major surface 227 and sintering to form a good ohmic contact between the metal contact 280 and the semiconductor material.

In an optional step, one or more antireflection coatings may be deposited on the aluminum gallium arsenide window layer 231. Two antireflection coatings which may be of $Al_2O_3$ and $T_iO_2$, respectively, may be used. Alternatively, a single antireflection coating being made of, for example, either $Si_3N_4$ or $Ta_2O_5$, may be employed. For simplicity, no antireflection coatings are shown in FIG. 3, however.

In the next step, a thick photoresist mask (not shown), typically 6 microns thick, is deposited on the aluminum gallium arsenide layer 231 exposed surface 226 (or, if present, the antireflection coating thereon). The photoresist is exposed with the desired pattern for the metallic contact lines 240. Grooves 243 are etched through the aluminum gallium arsenide layer 231 to the emitter layer 233 front surface 234. The width of the grooves 243 is typically 10–20 microns, for example.

The same photoresist mask is exposed a second time leaving openings therethrough (not shown) to the exposed major surface 226 of the aluminum gallium arsenide window layer 231 for the metallic strip 250, conductive bar 260, and metallic bridges 270. A thin layer 245 of Au-Zn alloy may be sputtered into the grooves 243 and the open areas to the exposed major surface 226 to a thickness of about 700–1000Å, after which a silver deposition 246 is E-beam evaporated to a thickness of 4 micrometers to form metallic contact lines 240, flat metal strip 250, conductive bar 260 and metallic bridge 270. The excess metal is lifted off and the patterned metallization sintered.

The front metallization including the contact lines 240, conductive bar 260, metallic bridges 270, and flat strip 250 may be fabricated by another technique. A thin photoresist mask is deposited to a thickness of about 2 micrometers, on the aluminum gallium arsenide layer 231 front exposed major surface 226. Use of the thin photoresist minimizes breakage during multiple exposures. The photoresist is exposed a first time yielding the pattern for the metallic contact lines 240. Grooves 243 about 5–10 microns wide are etched through the aluminum gallium arsenide layer 231 to the front major surface 234 of the emitter layer 233. The photoresist is exposed a second time providing the pattern for the metallic strip 250, conductive bar 260, and metallic bridges 270. A metal alloy such as zinc, gold and silver, for example, is sputtered over the patterns to a thickness of about 1000–2000Å. The excess metal is thereafter lifted off.

In the next step, the metal grid lines are plated with silver to a thickness of typically 5–10 micrometers. Thereafter, the metallization is sintered.

Although the invention has been shown and described with references to particular illustrated embodiments, nevertheless, various changes and modifications obvious to a person skilled in the art to which the invention pertains is deemed to lie within the purview of the invention.

What is claimed is:

1. A solar cell comprising:
    a first layer of semiconductor material of a first conductivity type;
    a second layer of semiconductor material of a second opposite conductivity type disposed on said first layer forming a semiconductor junction therebetween, said first and second layers having first and second major essentially parallel surfaces, respectively, essentially parallel to said semiconductor junction;
    a layer of aluminum gallium arsenide semiconductor material of said second conductivity type disposed on said second major surface and having an exposed front major surface essentially parallel to said second major surface and further having a plurality of grooves therein extending vertically therethrough to said second layer;
    electrically conductive material filling said grooves and electrically contacting said second layer to form metallic contact lines;
    a flat conductive bar transversely disposed on said exposed front major surface across said grooves and making electrical contact to said electrically conductive material in said grooves;
    an electrically conductive flat strip disposed on said exposed major surface and spaced apart from said conductive bar; and
    at least one electrically conductive bridge electrically coupling said conductive bar to said contact strip.

2. A solar cell as defined in claim 1 wherein said first conductivity type is N conductivity and said second conductivity type is P conductivity.

3. A solar cell as defined in claim 1 wherein said first conductivity type is P conductivity and said second conductivity type is N conductivity.

4. A solar cell comprising:
    a semiconductor body having a first pair of opposed substantially parallel sides, a second pair of opposed substantially parallel sides substantially perpendicular to said first pair of sides, and front and back essentially parallel major surfaces, substantially perpendicular to said sides, and three layers of impurity doped semiconductor material located between and essentially parallel to said front and back major surfaces, a first one of said layers being of a first conductivity type and located adjacent said back major surface, a second one of said layers being of a second conductivity type and located adjacent said first layer, a third of said layers being made of aluminum gallium arsenide, being of said second conductivity type, being located adjacent said second layer and defining said front major surface and further having a plurality of grooves therein longitudinally disposed between said first pair of opposed parallel sides and extending vertically through said third layer to said second layer;
    electrically conductive material disposed in said grooves for forming electrical contact lines;
    a flat contact strip made of conductive material disposed on said front major surface adjacent one of said sides of said second pair of sides and spaced from said contact lines;
    a flat electrically conductive bar transversely disposed on said front major surface across, and in electrical contact with said contact lines and spaced from said flat strip; and at least one electrically conductive bridge electrically coupling said contact strip to said conductive bar.

5. A solar cell as defined in claim 4 wherein said first conductivity type is N conductivity and said second conductivity type is P conductivity.

6. A solar cell as defined in claim 4 wherein said first conductivity type is P conductivity and said second conductivity type is N conductivity.

7. A solar cell as defined in claim 4 wherein said flat conductive bar and said flat conductive strip cross said front major surface and are essentially parallel to each other and said electrical contact lines are essentially perpendicular to said flat metallic bar.

8. A solar cell comprising:
first and second essentially parallel adjacent layers of impurity doped semiconductor material, said first layer being of a first conductivity type and said second layer being of a second opposite conductivity type so as to define a semiconductor junction between said first and second layers, said first and second layers having respective first and second essentially parallel major surfaces disposed essentially parallel to said semiconductor junction;

a layer of aluminum gallium arsenide of said second conductivity type disposed on said second major surface, said aluminum gallium arsenide layer having a front major surface essentially parallel to said second major surface;

a metallic contact strip disposed on said front major surface;

a metallic bar disposed on said front major surface and spaced apart from said contact strip;

a first plurality of metallic contact lines disposed on said front major surface and extending vertically through said aluminum gallium arsenide layer into electrical contact with said second layer, said contact lines being electrically connected to said contact strip;

a second plurality of metallic contact lines disposed on said front major surface and extending vertically through said aluminum gallium arsenide layer into electrical contact with said second layer, said contact lines being electrically connected to said conductive bar; and at least one metallic bridge located on said front major surface and electrically coupling said contact strip to said conductive bar.

9. A solar cell as defined in claim 8 wherein said first conductivity type is N conductivity and said second conductivity type is P conductivity.

10. A solar cell as defined in claim 8 wherein said first conductivity type is P conductivity and said second conductivity is N conductivity.

11. A solar cell as defined in claim 8, wherein said metallic contact strip crosses the extent of said front major surface, and said metallic bar crosses an intermediate section of said front major surface and is essentially parallel to metallic contact strip, and further wherein said first plurality of metallic contact lines are essentially parallel to each other and substantially perpendicular to said metallic bar, and said second plurality of metallic contact lines are essentially parallel to each other and substantially perpendicular to said metallic contact strip.

* * * * *

UNITED STATES PATENT AND TRADEMARK OFFICE
CERTIFICATE OF CORRECTION

PATENT NO. : 4,698,455

DATED : October 6, 1987

INVENTOR(S) : Bruce T. Cavicchi, Hans G. Dill, Dieter K. Zemmrich

It is certified that error appears in the above-identified patent and that said Letters Patent is hereby corrected as shown below:

Add Sheet 2, including FIGS. 2 and 3, of the drawings to the above-identified patent.

Signed and Sealed this

Fourteenth Day of June, 1988

*Attest:*

DONALD J. QUIGG

*Attesting Officer*  *Commissioner of Patents and Trademarks*